(12) United States Patent
Tuckey et al.

(10) Patent No.: US 10,330,725 B2
(45) Date of Patent: Jun. 25, 2019

(54) SYSTEMS, METHODS, AND DEVICES FOR MONITORING A CAPACITOR BANK

(75) Inventors: David T. Tuckey, Victoria (CA); Jean-Marc Lupin, Pers-Jussy (FR)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 1419 days.

(21) Appl. No.: 13/825,949

(22) PCT Filed: Sep. 29, 2011

(86) PCT No.: PCT/US2011/053834
§ 371 (c)(1),
(2), (4) Date: Mar. 25, 2013

(87) PCT Pub. No.: WO2012/044737
PCT Pub. Date: Apr. 5, 2012

(65) Prior Publication Data
US 2013/0204554 A1   Aug. 8, 2013

(30) Foreign Application Priority Data
Sep. 30, 2010   (EP) .................................... 10290519

(51) Int. Cl.
*G01R 31/28* (2006.01)
*G01R 19/25* (2006.01)
(Continued)

(52) U.S. Cl.
CPC ..... *G01R 31/2843* (2013.01); *G01R 19/2513* (2013.01); *G01R 31/028* (2013.01); *G06F 15/00* (2013.01)

(58) Field of Classification Search
CPC .... H02J 3/18; H02J 3/00; G06F 19/00; G06F 15/00; G05F 1/59; F25D 17/00;
(Continued)

(56) References Cited

U.S. PATENT DOCUMENTS

| 4,317,076 | A | * | 2/1982 | Price | .................... | H02J 3/1821 323/210 |
| 5,959,537 | A | * | 9/1999 | Banting | ................... | H02H 3/04 324/133 |

(Continued)

FOREIGN PATENT DOCUMENTS

| CN | 2498614 Y | 7/2002 |
| CN | 1786721 A | 6/2006 |
| CN | 101477160 A | 7/2009 |

OTHER PUBLICATIONS

M.Dhillion, D. Tziouvaras, "Protection of Fuseless Capacitor Banks Using Relays," presented at 26th Annual Western Protective Relay Conference, Spokane, WA, Oct. 1999, pp. 1-17.*

(Continued)

*Primary Examiner* — Regis J Betsch
*Assistant Examiner* — Kaleria Knox
(74) *Attorney, Agent, or Firm* — Lando & Anastasi, LLP

(57) ABSTRACT

Systems, methods, and devices for monitoring one or more capacitor banks are presented herein. One concept of the present disclosure is directed to a method of monitoring at least one capacitor bank having a plurality of steps. The method includes: receiving measurements indicative of voltages and/or currents on electrical lines coupled to the steps of the capacitor bank by corresponding contactors; receiving information indicative of the respective statuses of the contactors; timestamping the measurements and contactor status information; storing the timestamped measurements with corresponding timestamped contactor status information; determining a rate of change of a parameter indicative of or derived from at least the measurements associated with at least one of the steps in the capacitor bank; comparing the determined rate of change with a baseline rate of change to produce a deviation; determining if the deviation satisfies a (Continued)

criterion; and, if so, indicating the deviation satisfied the criterion.

20 Claims, 6 Drawing Sheets

(51) Int. Cl.
  *G06F 15/00* (2006.01)
  *G01R 31/02* (2006.01)
(58) Field of Classification Search
  CPC ......... H02P 3/18; H02H 3/00; G01R 31/2843;
           G01R 19/2513; G01R 31/028
  USPC ........ 702/57; 340/664; 307/82, 31; 318/812;
                   323/210; 361/64
  See application file for complete search history.

(56) References Cited

U.S. PATENT DOCUMENTS

| | | | |
|---|---|---|---|
| 6,671,635 B1 | 12/2003 | Forth et al. | |
| 6,687,627 B1 | 2/2004 | Gunn et al. | |
| 6,792,337 B2 | 9/2004 | Blackett et al. | |
| 7,787,231 B2* | 8/2010 | Yamashita | G11C 5/145 |
| | | | 361/220 |
| 2002/0154080 A1* | 10/2002 | Miyazaki | G09G 3/3696 |
| | | | 345/87 |
| 2003/0184325 A1* | 10/2003 | Koch | G01R 15/16 |
| | | | 324/713 |
| 2006/0022658 A1* | 2/2006 | Harriman | H02M 3/158 |
| | | | 323/284 |
| 2007/0182361 A1* | 8/2007 | Pande | H02P 1/029 |
| | | | 318/812 |
| 2008/0010549 A1 | 1/2008 | Coolidge et al. | |
| 2008/0077336 A1* | 3/2008 | Fernandes | G01R 15/142 |
| | | | 702/57 |
| 2008/0200748 A1 | 8/2008 | Testani et al. | |
| 2009/0174262 A1* | 7/2009 | Martin | H02M 3/157 |
| | | | 307/82 |
| 2009/0231764 A1 | 9/2009 | Banting et al. | |
| 2010/0002348 A1* | 1/2010 | Donolo | H02H 7/261 |
| | | | 361/64 |
| 2011/0121649 A1* | 5/2011 | Loldj | G05B 19/042 |
| | | | 307/31 |

OTHER PUBLICATIONS

Written Opinion corresponding to co-pending International Patent Application Serial No. PCT/US2011/053834, United States Patent Office, dated Feb. 27, 2012; (5 pages).

International Search Report corresponding to co-pending International Patent Application Serial No. PCT/US2011/053834, United States Patent Office, dated Feb. 27, 2012; (3 pages).

* cited by examiner

SYSTEMS, METHODS, AND DEVICES FOR MONITORING A CAPACITOR BANK

CLAIM OF PRIORITY AND CROSS-REFERENCE TO RELATED APPLICATIONS

This application is a U.S. National Phase of International Application No. PCT/US2011/053834, filed on Sep. 29, 2011, which claims the benefit of and priority to European Patent Application No. 10290519.7, filed on Sep. 30, 2010, the contents of both of which are incorporated herein by reference in their entireties.

FIELD OF THE INVENTION

The present invention relates generally to utility distribution systems and utility monitoring systems. More particularly, the present invention relates to systems, methods, and devices for monitoring one or more capacitor banks.

BACKGROUND

Conventional utility networks supply utilities for commercial, residential and industrial purposes. In a typical electrical distribution system, for example, electrical energy is generated by an electrical supplier or utility company and distributed to consumers via a power distribution network. The power distribution network is often a network of electrical distribution wires (more commonly known as "electrical transmission lines") which link the electrical supplier to its consumers. Additional devices, such as bus bars, switches (e.g., breakers or disconnectors), power transformers, and instrument transformers, which are typically arranged in switch yards and/or bays, are automated for controlling, protecting, measuring, and monitoring of substations.

Typically, electricity from a utility is fed from a primary station over a distribution cable to several local substations. At the local substations, the supply is transformed by distribution transformers from a relatively high voltage on the distributor cable to a lower voltage at which it is supplied to the end consumer. From the local substations, the power is provided to industrial users over a distributed power network that supplies power to various loads. Such loads may include, for example, various power machines, lighting, HVAC systems, etc.

Some electrical distribution networks, such as multi-phase alternating current (AC) networks, undergo heavier burden when large reactive loads are repeatedly connected to and disconnected from the distribution line. These variations in power circulation can result in low system efficiency and high energy losses. For instance, energy losses can occur when large inductive loads are connected to the distribution lines, which can produce an inordinate amount of lagging reactive current in the line.

In general, the power factor of an AC electric power system is the ratio of the real (or "active") power used in a circuit to the apparent power used by the circuit. Real power, which is typically expressed in watts (W) or kilowatts (kW), is the capacity of the circuit for performing work in a particular time, whereas apparent power, which is typically expressed in volt-ampere (VA) or kilo volt-ampere (kVA), is the product of the current and voltage of the circuit. It is often desirable to increase the power factor of a system.

Power factor correction (PFC) can be achieved, for example, by switching in or out banks (or racks) of capacitors. A capacitor bank is typically composed of a number of discrete steps that can be switched in and out of operation. Each step is composed of a number of individual capacitors that are wired in parallel (or series, depending upon the system), and sum together to provide the total capacitance for the step. One conventional device used for controlling the switching of the capacitor banks onto and off of the distribution lines are power factor controllers. The controller device can switch the connectivity of the capacitor bank as needed to correct the power factor for the load detected at any given time. Conventional power factor controllers switch the capacitor bank into and out of the electrical line on the basis of a number of measurable parameters, such as reactive current, voltage, time, temperature, etc.

Power capacitors are naturally prone to aging effects that can change their electrical characteristics (e.g., capacitance, equivalent resistance, etc.), which in turn can reduce their effectiveness. Depending on the materials used, the design type, and the details of manufacturing, for example, some capacitors may be prone to different types of failure if their electrical characteristics change at a faster rate than expected from normal aging. In some cases, these failures can be mitigated by a self-protection mechanism, which is activated, for example, by overpressure, overtemperature, and/or overcurrent, removing the capacitor from the circuit. Other cases may lead to a failure where the self-protection mechanism fails to operate.

It is common today for capacitor bank installations to have very limited or no monitoring and diagnostics available, due in part to the expense associated with monitoring the health of individual steps within a capacitor bank. As a result of this limited monitoring and diagnostics, it is very difficult to detect operational problems before they occur in order to mitigate operational concerns and minimize service disruption through regular maintenance efforts.

SUMMARY

According to one aspect of the present disclosure, a method is presented for monitoring at least one capacitor bank having a plurality of steps. The method includes: receiving measurements indicative of voltages or currents or both on respective electrical lines operatively coupled to the plurality of steps of the capacitor bank by corresponding contactors; receiving status information indicative of respective statuses of the contactors; timestamping the measurements and the contactor status information; storing the timestamped measurements with corresponding ones of the timestamped contactor status information; for at least some of the stored timestamped measurements and contactor statuses, determining a rate of change of a parameter indicative of or derived from at least the measurements associated with at least one of the plurality of steps in the capacitor bank; comparing the determined rate of change with a baseline rate of change to produce a deviation; determining if the deviation satisfies a criterion; and, responsive to the deviation satisfying the criterion, indicating the deviation satisfied the criterion.

In an optional aspect, the comparing includes determining a difference between the baseline rate of change and the determined rate of change, wherein the deviation satisfies the criterion if the difference exceeds a predetermined threshold. In this instance, the indicating includes, responsive to the difference exceeding the predetermined threshold, displaying an indication that the associated step has a potential problem.

In another optional aspect, the method further comprises determining a confidence level for each of the steps in the capacitor bank, and indicating the confidence level for each of the steps. The confidence level indicates a confidence of a potential problem for each of the steps.

In another optional aspect, the confidence level includes a high level, a medium level, and a low level. In this instance, the method further comprises: assigning the high level of confidence to respective ones of the steps when the respective step, within a period of observation, always yields a deviation between the determined rate of change for that step and the baseline rate of change; assigning the medium level of confidence to respective ones of the steps in a two-step combination which yield a deviation for any of the steps not assigned the high level of confidence; and, assigning the low level of confidence to respective ones of the steps in a combination of steps not associated with any deviations between the determined rate of change for that step and the baseline rate of change.

In another optional aspect, the method further comprises communicating at least one instruction to cause a disconnection of the respective ones of the steps assigned the high level of confidence.

In another optional aspect, the method further comprises disregarding respective ones of the measurements that are unstable due to a recent status change of one or more of the corresponding contactors.

In another optional aspect, the disregarding includes discarding respective ones of the measurements taken within a predefined interval after the recent status change of the one or more corresponding contactors.

In another optional aspect, the method further comprises: comparing a set of status information values from a previous measurement interval to a set of status information values in a current measurement interval; and concluding that the measurements are unstable if the previous set of status information values is different from the current set of status information values.

In another optional aspect, the method further comprises: normalizing the measurements against a normalizing parameter. The normalizing parameter can include, for example, voltage magnitude, measured frequency, measured reactive power, or ambient temperature.

In another optional aspect, the determining the rate of change includes identifying discrete steps in the measurements, and removing the discrete steps when determining the rate of change.

In another optional aspect, the determining the rate of change includes calculating a best-fit curve and measuring the slope of the best-fit curve at a predefined interval.

In another optional aspect, the method further comprises calculating a value for a predetermined parameter from the received measurements. In this instance, the calculating the predetermined parameter and the receiving status information are substantially synchronized.

In another optional aspect, receiving the status information includes receiving the status information from the contactors or receiving the status information from a power factor correction (PFC) controller operatively connected to the contactors.

In another optional aspect, the baseline rate of change is a preset value for a given type of parameter.

In another optional aspect, the method further comprises determining a new baseline rate of change each time the received status information includes a new contactor status combination not previously received.

In another optional aspect, the method further comprises determining the baseline rate of change for one electrical phase of a phase-specific measurement from measurements for at least two other electrical phases.

In another optional aspect, the determined rate of change and the baseline rate of change are in units of percent change of the predetermined parameter per unit time.

According to another aspect of the present disclosure, one or more machine-readable non-transitory storage media include instructions which, when executed by one or more processors, cause the one or more processors to perform operations associated with a capacitor bank monitoring system. These operations include: receiving measurements indicative of voltages or currents or both on respective electrical lines operatively coupled to a plurality of steps in a capacitor bank by corresponding contactors; receiving status information indicative of respective statuses of the contactors; timestamping the measurements and the contactor status information; storing the timestamped measurements with corresponding ones of the timestamped contactor status information; for at least some of the stored timestamped measurements and contactor statuses, determining a rate of change of a parameter indicative of or derived from at least the measurements associated with at least one of the plurality of steps in the capacitor bank; comparing the determined rate of change with a baseline rate of change to produce a deviation; determining if the deviation satisfies a criterion; and, responsive to the deviation satisfying the criterion, indicating the deviation satisfied the criterion.

According to yet another aspect of the present disclosure, a method is presented for monitoring a plurality of capacitor banks, each of which has a plurality of steps, where each of the steps includes at least one capacitor. The method includes: receiving measurements indicative of voltages and currents on respective electrical lines selectively coupled through corresponding contactors to the plurality of steps in each of the plurality of capacitor banks; receiving status information indicative of a respective binary status of each of the contactors; timestamping the measurements and the contactor status information; storing each of the timestamped measurements with a corresponding combination of the timestamped contactor status information; for each contactor status combination, calculating a rate of change indicative of degradation of each of the steps in each of the capacitor banks; comparing the calculated rate of change with a baseline rate of change to determine if a deviation exists between the baseline rate of change and the calculated rate of change; if the deviation exists, analyzing the deviation to determine if the deviation satisfies a criterion; and, if the deviation satisfies the criterion, outputting a notification indicating that the deviation satisfies the criterion The above summary is not intended to represent each embodiment or every aspect of the present disclosure. Rather, the foregoing summary merely provides an exemplification of some of the novel features included herein. The above features and advantages, and other features and advantages of the present disclosure, will be readily apparent from the following detailed description of the embodiments and best modes for carrying out the present invention when taken in connection with the accompanying drawings and appended claims.

Figure 1:
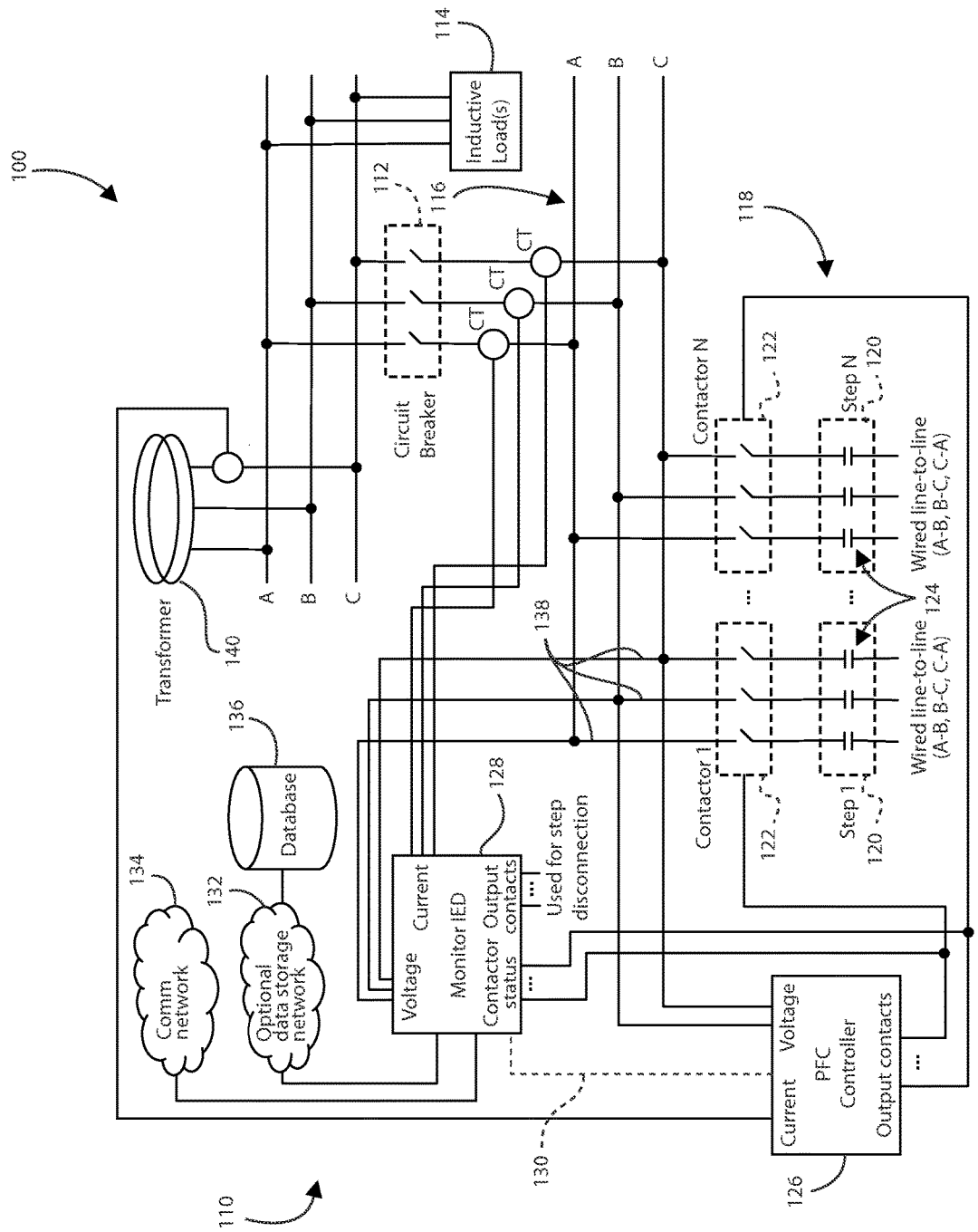
FIG. 1 is a schematic diagram of an exemplary capacitor bank installation with a monitoring system according to aspects of the various embodiments disclosed herein.

While the present disclosure is susceptible to various modifications and alternative forms, specific embodiments have been shown by way of example in the drawings and will be described in detail below. It should be understood, however, that the present disclosure is not intended to be limited to the particular forms disclosed. Rather, the present disclosure is to cover all modifications, equivalents, and alternatives falling within the spirit and scope of the invention as defined by the appended claims.

DETAILED DESCRIPTION

While aspects of the present disclosure are susceptible of embodiment in many different forms, there is shown in the drawings and will herein be described in detail representative embodiments of the present disclosure with the understanding that the present disclosure is to be considered as an exemplification of the various aspects and principles of the present disclosure, and is not intended to limit the broad aspects of the present disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference or otherwise.

This disclosure provides simple and cost-effective methods, systems and devices for monitoring one or more capacitor banks According to some aspects of the present disclosure, an Intelligent Electronic Device (IED) is provided that regularly monitors and stores the electrical characteristics of the voltage and/or current within a distribution system using at least one capacitor bank, as well as the status of the contactor(s) for each step in the capacitor bank. In a subsequent operation, the data stored in the IED is analyzed to detect trends that require notification to and/or action by the end user or a competent services organization. The analysis and notification/action may be performed within the IED itself, or on a separate computing device that has direct access to the data stored by the IED.

In some embodiments, the IED has inputs for three-phase voltage and current, which may be analogue signals from traditional current transformers (CT's) and potential transformers (PT's) connected to the power system, or analogue signals from a direct connection to the power system (if the IED is capable of monitoring that signal range), or even digital samples representing each channel (received from a digital sensor or merging unit). The IED can also have digital inputs to read the status of the contactor for each step in the capacitor bank. Additionally, the IED can have access to a communications network and a database, either locally within the IED or remotely through the communications network.

Some of the advantages provided by the features of the present disclosure include early detection of capacitors that are not operating as effectively as desired, and early detection of capacitors that have been removed from the circuit through their self-protection mechanism, each of which can lead to more efficient power use and a lower electrical bill. Other benefits include early detection of capacitors whose electrical characteristics are exhibiting a trend toward a failure, thereby reducing potential operational concerns and damage to the rest of the capacitor bank. In addition, aspects of the present disclosure help minimize the need for regular manual inspection of capacitor banks, which reduces labor costs, and provide for proactive notification to the customer and/or manufacturer of capacitors that require maintenance.

Referring to the drawings, wherein like reference numerals refer to like components throughout the several views, FIG. 1 is a functional diagram schematically illustrating an exemplary capacitor bank installation, designated generally as 100, with a capacitor bank monitoring system, designated generally as 110. The capacitor bank installation 110 of FIG. 1 includes a three-phase circuit breaker 112 that electrically connects (and selectively disconnects) the Inductive Load(s) 114 and transformer 140 to a second busbar 116. Although not shown in FIG. 1, a main busbar (or main service) is typically positioned between the transformer 140, the circuit breaker 112, and the inductive load(s) 114. The circuit breaker 112 is used specifically for the different steps 120 of the capacitor bank 118, allowing for the disconnection of the entire capacitor bank 118 at a single location within the installation 100. In the illustrated embodiment, each of the steps 120 in the capacitor bank 118 is composed of one or more individual capacitors, collectively designated as 124, that are wired in parallel. In the electrical utility context, the capacitor bank 118 can be based on, for example, ReactiVar® AV4000 and AV5000 Standard Automatic Power Factor capacitor banks, the ReactiVar® AV6000 Anti-Resonant Power Factor capacitor bank, or the ReactiVar® Medium Voltage Automatic Power Factor Correction banks, all of which are available from Schneider Electric (formerly Power Measurement Ltd.) of Saanichton, B.C. Canada. Likewise, the individual capacitors 124 can be based on, for example, ReactiVar® dry fixed capacitors or ReactiVar® MVC fixed capacitors, also available from Schneider Electric.

A respective three-phase contactor 122 selectively connects each of the capacitor steps 120 to the second busbar 116. In particular, each three-phase contactor 122 is operable to switch a corresponding step 120 onto and off of respective distribution lines, some of which are labeled 138 in FIG. 1. The contactors 122 can be based on, for example, the Class 8502 Type S Magnetic NEMA Contactors available from Schneider Electric or other suitable capacitor switching contactors. The step contactors 122 are controlled in FIG. 1 by the power factor correction (PFC) controller 126, which monitors the power factor on the end user's utility system, for example, and corrects an inductive power factor by switching in capacitor steps 120 as needed. For example, the PFC controller 126 can be an advanced microprocessor-based reactive power controller that measures power factor via a single remote current transformer, and switches capacitor steps 120 in and out of service to maintain a user-selected target power factor. Although not so restricted, the PFC controller 126 of FIG. 1 monitors the power factor on only one phase, assuming a balanced system.

The capacitor bank monitoring system 110 also includes an Intelligent Electronic Device, identified as "Monitor IED" 128 in FIG. 1. The IED 128 may be a microprocessor-based controller that is operable to receive data from sensors, monitoring devices, power equipment, and/or other sources of information, and issue control commands, such as tripping circuit breakers or switching capacitor bank connectivity, if voltage, current, or frequency anomalies are sensed. By way of non-limiting example, the Monitor IED 128 can be based on the PowerLogic® CM3000/CM4000 Series Circuit Monitor, the PowerLogic® PM700 and 800 Series Power-Monitoring Units, or the PowerLogic® ION 7550/7650 Series Power and Energy Meter, all of which are available from Schneider Electric. In addition, various IED devices and method of use are described in detail in U.S. Pat. No. 6,671,635, to J. Bradford Forth et al., entitled "Systems for Improved Monitoring Accuracy of Intelligent Electronic Devices," U.S. Pat. No. 6,687,627, to Colin N. Gunn et al., entitled "Electric Charge Storage Apparatus and Method for an Intelligent Electronic Device," and U.S. Pat. No. 6,792,337, to Andrew W. Blackett et al., entitled "Method and System for Master Slave Protocol Communication in an Intelligent Electronic Device," all of which are incorporated herein by reference in their respective entireties.

The Monitor IED 128 of FIG. 1 is shown having its voltage and current inputs connected below the circuit breaker 112 (i.e., downstream from the circuit breaker 112), thereby allowing the Monitor IED 128 to monitor the current/power/etc. delivered to the capacitor bank 118. This point of installation provides more detailed information about the health of the capacitor bank 118. As used herein, the "health" of a capacitor bank 118, a step 120 within a respective bank 118, or a capacitor 124 within a respective step 120 is to be construed in accordance with the ordinary meaning as used by those of ordinary skill in the art. In one non-limiting example, the "health" may be construed as the relative functionality or degree of degradation of the component or subcomponent due to, for example, aging, wear and tear, etc., whether normal or abnormal. Alternatively, the voltage and/or current inputs of the Monitor TED 128 can be connected above the circuit breaker 112 (i.e., upstream from the circuit breaker 112), for example, at the output of the transformer 140. This optional point of installation may provide a less detailed view of the capacitor bank, but may be a more practical approach, due to both a greater ease of physical installation and the fact that three-phase metering devices are often already installed at that level.

The Monitor IED 128 of FIG. 1 is shown having inputs for the binary status of each contactor 122 in the capacitor bank 118. Alternatively, the Monitor IED 128 can receive information about the contactor status directly from the PFC controller 126, such as via communications link 130, to allow the Monitor IED 128 to track exactly which steps 120 are engaged at a given time. The Monitor IED 128 of FIG. 1 also has output contacts that can be used to override the output contacts of the PFC controller 126 in order to disconnect steps where necessary. These inputs and outputs can all be realized using standard digital I/O ports.

Finally, two networks are shown in FIG. 1: an optional data storage network 132 and a general communications network 134. The data storage network 132 operatively connects the database 136 to the Monitor IED 128 such that the database 136 can be in a physically separate location from the IED 128. This configuration allows the analysis and notification/action to be implemented in a separate computing device, such as a personal computer or laptop computer (not shown) if desired. Alternatively, a resident database can be stored inside of the Monitor IED 128, and the implementation of analysis and notification/action can be performed locally. In this instance, the remote database 136 illustrated in FIG. 1 could be eliminated. The general communications network 134 allows the Monitor IED 128 to provide notification to selected users and/or to the manufacturer's services organization. Any standard communications network could be chosen, with an Ethernet network being the most popular anticipated option.

Figure 2:
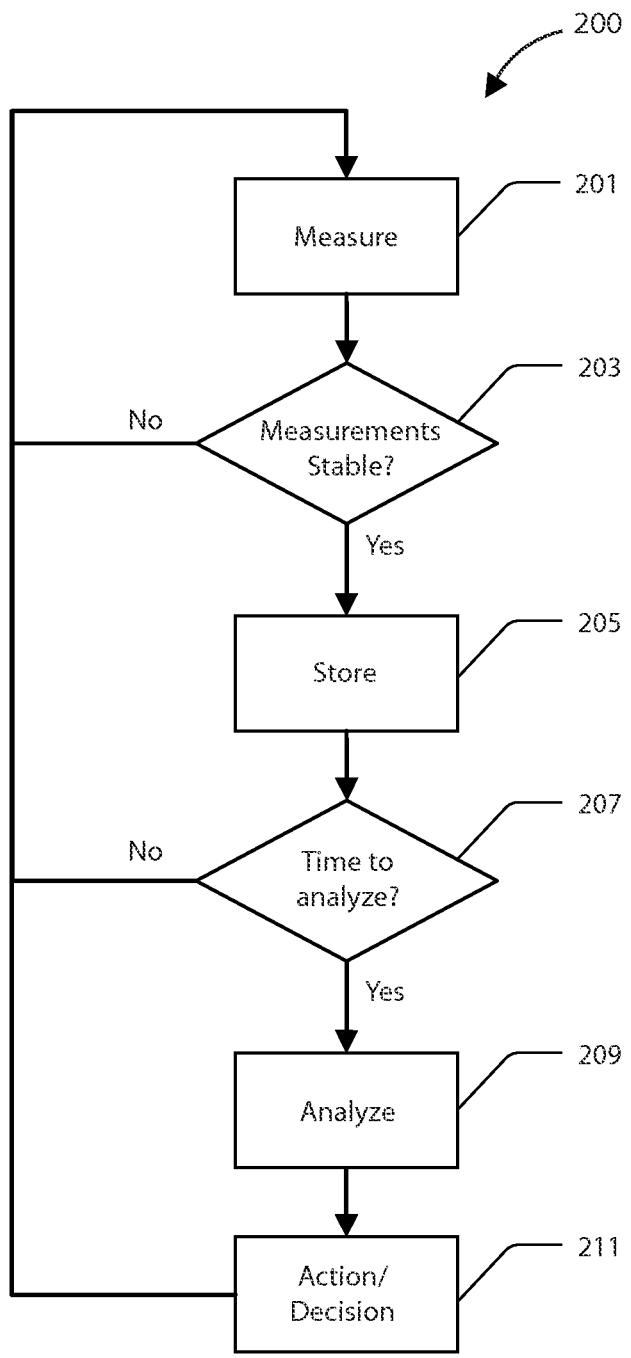
FIG. 2 is a flowchart of an exemplary algorithm or method of monitoring one or more capacitor banks according to various aspects of the embodiments disclosed herein.

With reference now to the flow chart of FIG. 2, an improved method 200 for monitoring one or more capacitor banks is generally described in accordance with various embodiments. FIG. 2 represents an exemplary algorithm that corresponds to at least some instructions that may be executed by a controller, such as the central processing unit (CPU) of a computer, to perform any or all of the following described functions associated with the disclosed concepts. The instructions corresponding to the algorithm 200 can be stored on a non-transitory computer-readable medium, such as on a hard drive or other mass storage device or a memory device.

Figure 3:
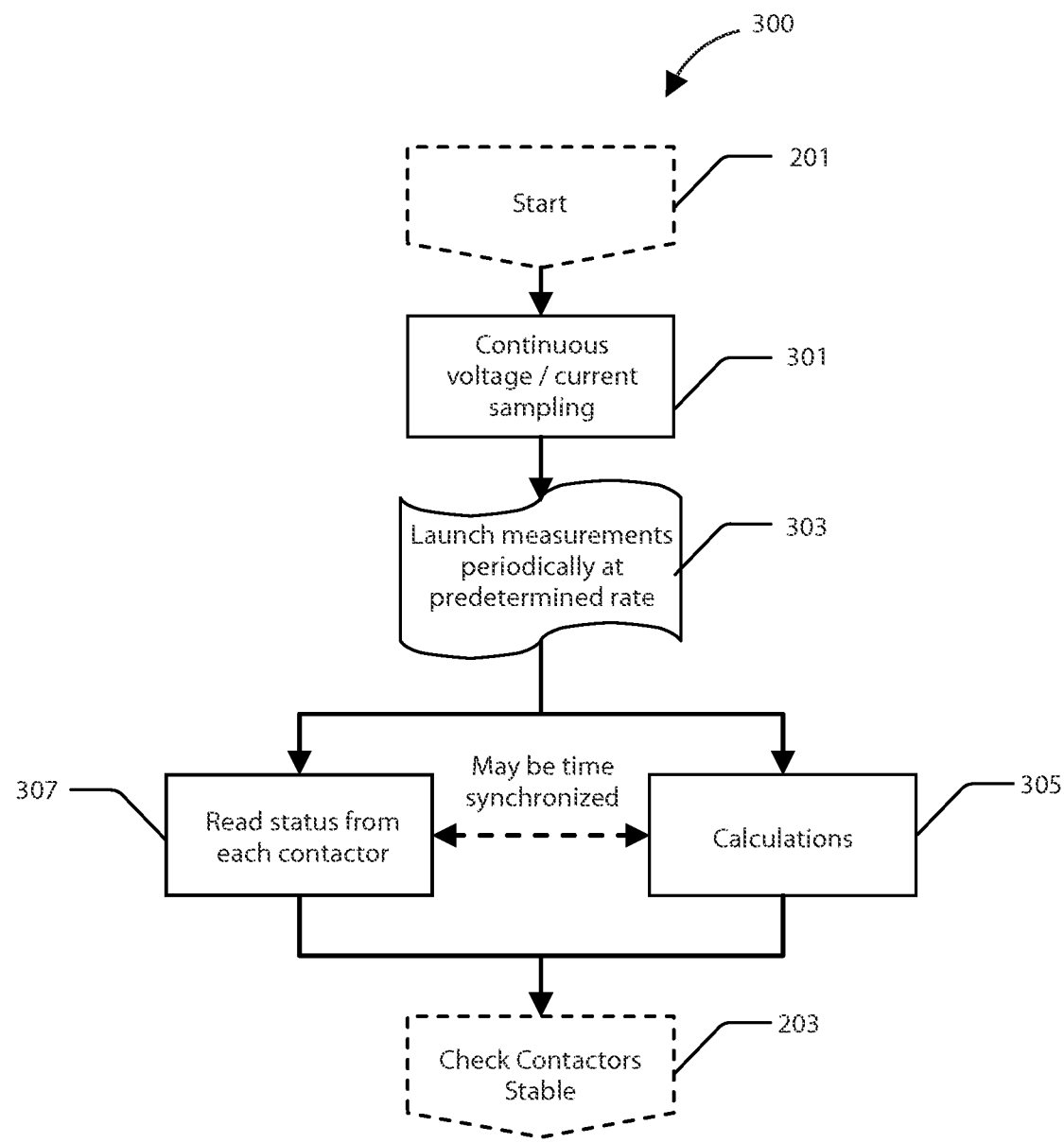
FIG. 3 is a flowchart of an exemplary measure component for the method presented in FIG. 2.

The method 200 starts with the "Measure" component presented in block 201 of FIG. 2. In the illustrated embodiment, the Measure component of block 201 describes how the Monitor IED 128 handles some of the information received as inputs, such as the voltage and current channels and the step contactor status values. The flowchart provided in FIG. 3 illustrates several operations that, together, describe an exemplary Measure component 300. The Monitor IED 128 can continuously sample voltage and current inputs at a predetermined sampling rate, such as every second, every fraction of a second, or every number of seconds, as indicated by block 303 in FIG. 3. A new set of measurements is then periodically launched at block 305 based on a predetermined rate, referred to herein as Rate 1. As an example, this rate could be once per second.

When it is time to proceed with a set of measurements based, for example, on Rate 1, the Monitor IED 128 proceeds with two parallel measurement paths, as indicated in FIG. 3 by blocks 305 and 307. At block 305, the Monitor IED 128 performs a set of calculations on the collection of voltage and current samples from the current measurement interval, as described in further detail below. At block 307, the Monitor IED 128 receives or detects the instantaneous binary status value (e.g., 0=on; 1=off) from each of the step contactors 122. The two parallel paths associated with the operations in blocks 305 and 307 of FIG. 3 can be executed in a time-synchronized fashion to maximize the ability to later correlate the electrical measurements with the contactor status values that were present at that time. Alternatively, if the operations set forth in blocks 305 and 307 are not time-synchronized, then the IED 128 may be required to discard any values in the measurement interval following a step change to ensure the readings are stable. This is discussed below with respect to block 203 of FIG. 2.

The calculations designated in block 305 may include, for example, any electrical measurements derived from the voltage and current samples, which may be advantageous to track to observe trends over time. Examples of general measurements that could be calculated include volts (V), amps (A), watts (W), volt-ampere reactive or reactance (vars), power factor, energy (measured in joules (J) or watt-hours (Wh)), voltage/current/power harmonics (measured in V/A/W/VAR (or % of fundamental values) at a frequency measured in hertz—Hz), and waveforms. Further, depending on the electrical model of the capacitor steps 120 themselves, it may be possible to derive an estimation for the properties of the capacitor steps 120 currently engaged, such as the total capacitance, which is measured in farads (F), and equivalent resistance, which is measured in ohms ($\Omega$). The set of calculated values will then be passed to the next block, along with the contactor status values.

Referring back to FIG. 2, the method 200 also includes determining if the measurements are stable at block 203. In some embodiments, the stability check component 203 functions to disregard or discard any measurements that may be unstable due to a recent change in the step contactors 122—e.g., one or more steps 120 being switched in or out. This would be accomplished, in one example, by comparing the set of step contactor values in the current measurement interval (acquired at blocks 305 and 307) to the values from a previous measurement interval. If the contactor values are the same in both intervals, then the measurements and contactor values are assumed to be valid, and they are passed on to the next block (e.g., block 205). In the illustrated embodiment, if the contactor values are different from one interval to the next, then the method 200 returns to the Measure block 201 without passing through the other blocks in the flowchart of FIG. 2.

In some embodiments, the stability check component 203 functions to ensure that a predetermined number of measurement intervals pass or that a predetermined amount of time passes after any step change before continuing to store and analyze the data. For example, the Monitor IED 128 can be configured to detect when the status of a step contactor 122 changes, and responsively disregard or discard any measurements over the subsequent, say, five measurement intervals (or five seconds) as being automatically deemed "not stable." This optional approach provides a more flexible interpretation of the stability of the system. As mentioned above, one reason for disregarding or discarding measurements in this manner would be if the calculations identified at block 307 of FIG. 3 and the contactor status readings of block 307 are not time-synchronized. Another reason for disregarding or discarding measurements in this manner is to allow a sufficient period of time for the measurements to stabilize after a contactor switch, as there may be a short period after a contactor switch where the associated measurements fluctuate.

The method 200 also includes storing timestamped measurements with corresponding timestamped contactor status information at block 205. For example, the Store component 205 takes as an input a stable set of measurements and the associated step contactor status values, and writes all of this data together with a timestamp to stored memory. As indicated above, the storage mechanism could be internal to the Monitor IED 128, using any kind of memory storage technology available, such as volatile memory (e.g., a random-access memory (RAM)) and non-volatile memory (e.g., an EEPROM). Alternatively, the storage mechanism can be physically separate from the Monitor IED 128, such as the database 136 of FIG. 1 that is connected to the Monitor IED 128 through the optional data storage network 132. If using a physically separate database, the manner of storing that data can utilize, for example, a web-based approach or a monitoring software package, such as the PowerLogic® ION Enterprise software power management solution available from Schneider Electric.

According to some aspects of the present disclosure, the data being stored for a given measurement interval is correlated together such that the contactor status values from that given measurement interval are associated with each of the measurements stored for that given interval. The contactor status values may be seen as individual bits in an integer used as an identifier tag. For example, if there are 10 steps in a capacitor bank, the 10 contactor status values could be considered as 10 bits in an integer used as an identifier tag. The entire set of timestamped stored data is made available to the Analyze block 209 of FIG. 2 in order to search for any relevant trends in a series of measurement intervals.

At block 207, the method 200 of FIG. 2 determines whether it is time to proceed with a periodic analysis step based on a predetermined analysis rate, referred to here as Rate 2. As an example, this rate could be once per day. If it is not yet time to proceed (i.e., block 207=No), then the method 200 returns to the Measure block 201 without passing through the remaining blocks in the flowchart of FIG. 2. However, when the time comes to launch a new analysis (i.e., block 207=Yes), the program flow moves to the Analyze block 209. Note that blocks 207, 209 and 211 can be performed either in the Monitor IED or in a separate computing device if desired.

Figure 4:
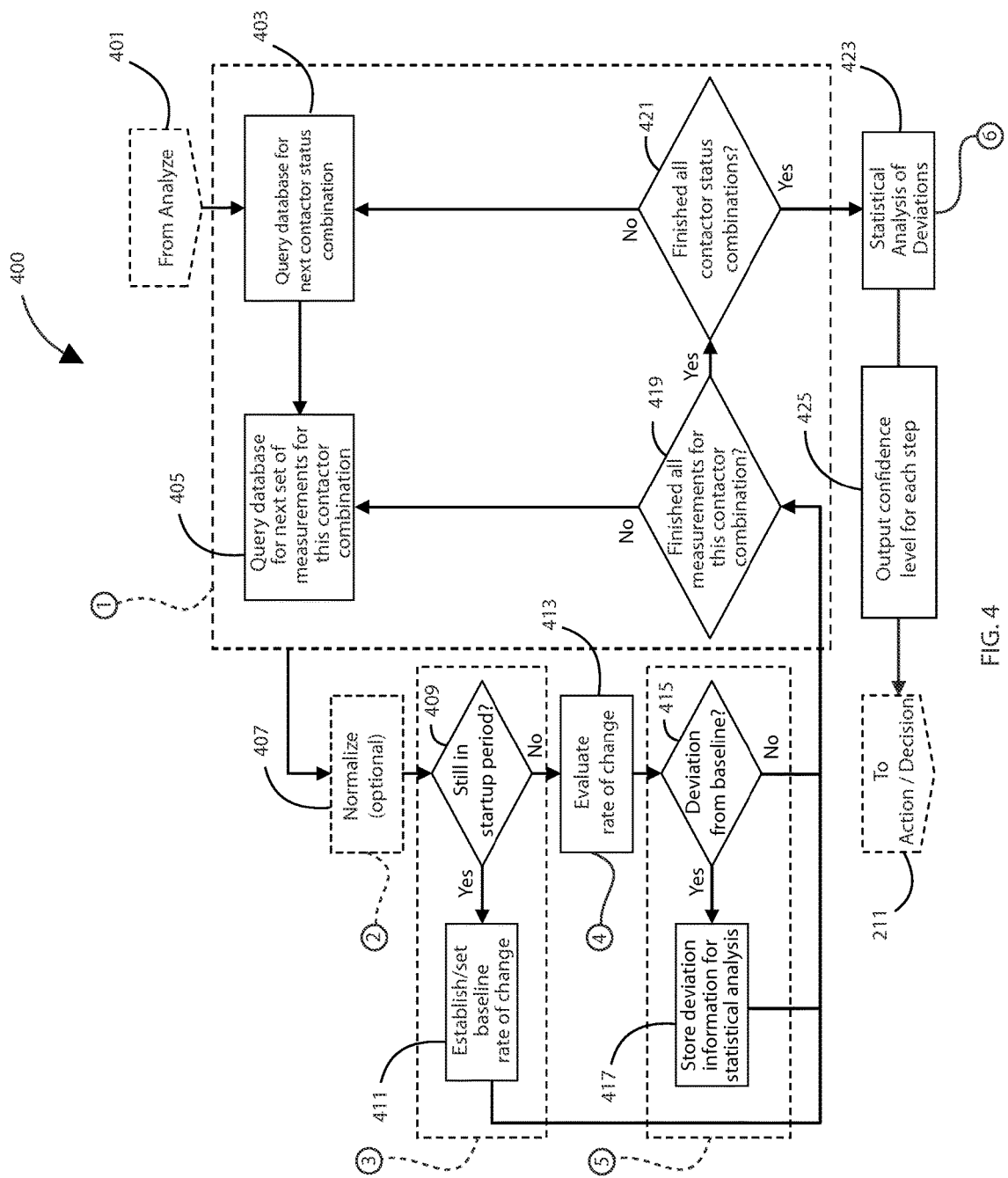
FIG. 4 is a flowchart of an exemplary analyze component for the method presented in FIG. 2.

The method 200 continues with the "Analyze" component presented in block 209 of FIG. 2. In the illustrated embodiment, the Analyze block 209 describes how the method 200 performs a periodic analysis on the stored values in order to assess the health of a capacitor bank 118 and the individual steps 120 thereof FIG. 4 is a flowchart of an exemplary analyze component 400 for the method presented in FIG. 2. Six different functional areas are shown in the flowchart of FIG. 4, each of which is identified in FIG. 4 with a corresponding circled number. These six areas are described in detail below using the numbers for reference.

(1) Scan Database Over Selected Interval

The first area of FIG. 4 controls the functional loop through all of the stored contactor status combinations (to a theoretical maximum of $2^n$ combinations for n discrete steps), and through all of the stored measurements for each contactor status combination. The first functional area of FIG. 4 begins at block 403 by querying the database 136 (or other data storage) for the next contactor status combination. The first functional area continues to block 405 by querying the database 136 (or other data storage) for all measurements that have the same set of contactor status values over a selected time interval, introduced here as Rate 3.

The time interval of Rate 3 can be the same as the analysis interval (i.e., Rate 2), discussed above, or can be a different interval of time. For example, the analysis interval can be set to once per day, and the data considered during the analysis block 209 could be all data from the previous day. In this case Rate 3=Rate 2. Alternatively, the analysis interval can be set to once per day, and the data considered during the analysis block 209 could be all data from a different interval, for example, setting Rate 3 to analyze data from the past 7 days. In this case Rate 3 covers a longer time period than Rate 2. The choice of interval length for Rate 3 can be implementation-dependent and/or user selected.

After receiving all of the measurements for a given set of contactor status values over the interval defined by Rate 3, the first functional area of FIG. 4 loops through each of the measurements, looking at all the values for one parameter, and then all the values for the next parameter, etc. For each parameter, the timestamped set of values over the Rate 3 interval length is passed on to the next functional area.

(2) Normalize

Some of the measured parameters should be normalized before evaluating their rate of change. This helps to ensure a fair comparison between values measured at different times. The normalization operation presented at block 407 can be viewed as a simple linear model of one parameter versus another (e.g., using value pairs instead of a single value). Some examples of possible normalization factors include, in non-limiting examples, the measured voltage magnitude, the measured frequency, the measured reactive power (kvar), or the ambient temperature. Other normalization methodologies are also envisioned as being within the scope and spirit of the present disclosure.

By way of example, the measured parameter may be active power, which is measured in watts (W). The measured values for watts can vary proportionally with the voltage magnitude applied or with the resulting value for reactive power (kvar). In this example, variations in watts alone are generally not enough to indicate a deviation from normal behavior since the variation may simply be caused by an expected variation in the applied voltage magnitude. Consequently, in an application where power is the measured parameter, block 407 can normalize the measurements for watts against the voltage (watts/volt) or against the reactive power (watts/kvar) before attempting to evaluate the rate of change.

As indicated in FIG. 4, the normalization operation featured in block 407 is optional, and therefore may be eliminated altogether or may be applied to only certain types of measurement and not others. In some embodiments, the normalization factor is predefined for a given measurement to ensure predictable behavior. If normalization is applied to a measurement, each of the timestamped values for that measurement will be normalized in the same way, and then passed on to the next block.

(3) Baseline Rate of Change

For each combination of contactor status values and each type of measurement for a given contactor combination, a baseline rate of change is required to compare against a measured rate of change that will be determined, for example, in the fourth functional area, which is discussed in detail below. Accordingly, the third functional area of FIG. 4 operates to determine a baseline rate of change at block 411; there are several possible approaches for determining the baseline rate of change.

In a first non-limiting example, the baseline rate of change can be preset to a hard-coded value for a given type of parameter. For instance, it may be expected that the estimated capacitance will decline at a certain rate over time, e.g., estimated under normal circumstances to be 1% per year. In this instance, the baseline rate of change for a capacitance measurement can be preset to 1% per year (or the equivalent for a different time base such as the Rate 3 interval).

In a second non-limiting example, the baseline rate of change can be derived from the sets of measurements already stored locally on the Monitor IED 126 or remotely on the database 136. For one instance, the calculated rate of change from previously analyzed measurements can be evaluated or otherwise utilized to establish a baseline rate of change for subsequent measurements. In another instance, the baseline rate of change may potentially be different for each combination of contactor status values and for each type of measurement for a given contactor combination. As such, each time a new contactor status combination is encountered for the first time, it may be necessary to determine a new baseline rate of change before checking for a deviation between the baseline and calculated rate of change. For instance, during the startup period, a rate of change is calculated on the measurements that are available, for example, in the same way as described above with respect to block 413. This ensures that the baseline rate of change is calculated in a consistent manner with the rate of change being compared after the startup period. Once a sufficient number of measurements have been collected for the given combination, this calculated rate of change becomes the new baseline rate of change, and the startup period is complete.

In a third non-limiting example, the baseline rate of change for one phase can be derived based on the measurements for the other phases. In phase-specific measurements, for example, the baseline for one phase can be derived from the measurements for the other two phases. In this case, it is possible to detect an imbalance between phases in the rate of change for a given measurement. A phase imbalance is one potential sign of an unhealthy capacitor. The concept here is that it is possible, in some embodiments, to compare the calculated rate of change for one phase (e.g., at block 413) to the calculated rates of change for the other two phases. In this specific case, the baseline is defined (e.g., at block 411) to operate in a mode where it compares against the other two phases instead of defining it as a single numeric value. Then, when it is determined if there is a deviation from the baseline (e.g., at block 415), the baseline compares against the two calculated rates of change for the other two phases (e.g., from block 413, which will vary over time) instead of comparing to a single predetermined value.

Prior to determining the baseline rate of change at block 411, functional area 3 of FIG. 4 includes a check to see if the system is still in the startup period at block 409. This can be applied separately to each combination of contactor status values and for each measurement for a given combination. Thus, there may be a different "startup period" for each combination, and the "startup period" is not simply a preset length of time. For example, a startup period can be the time to get enough sets of measurements for each combination.

Once the baseline rate of change has been determined, the program flow continues to step 4.

(4) Calculated Rate of Change

For at least some of the stored, timestamped measurements and contactor statuses, a rate of change is determined for a parameter that is indicative of or derived from the measurements associated with at least one of the plurality of steps 120 in the capacitor bank 118. To this end, the analyze component 400 of FIG. 4, as indicated in block 413, evaluates the observed rate of change of this parameter in the fourth functional area (in units of percent change per unit time) for the set of timestamped values representing data from the preceding Rate 3 interval.

Various mathematical approaches are available for calculating the rate of change for a set of timestamped values. For illustration purposes, one specific example would be to calculate a best-fit curve among the data points, and to measure the slope of the curve at the end of the interval. An alternative example would be to average the first five measurements over the interval (and their timestamps), and to average the last five measurements (and their timestamps), and to calculate the slope of the line connecting these two averages. Regardless of the mathematical approach chosen, the resulting calculation should be a number expressed as a percent change per unit time for this combination.

An additional component in the operation set forth in block 413 of FIG. 4 is to account for the "expected" failure mode of a capacitor, where a self-protection mechanism within one of the capacitors 124 in a step 120 acts to remove the capacitor from the circuit. In some embodiments, a self protection mechanism is an automated disconnection device that is activated, for example, by overpressure, overtemperature, overcurrent, thereby removing the capacitor from the circuit. To facilitate detection of an "expected" failure mode, the magnitude of the discrete change can be setup according to the structure of the steps, i.e., the number of capacitors. While uncommon, this type of failure is considered to be a normal occurrence, and is generally not a significant concern. If a capacitor is removed from the circuit by a self-protection mechanism, there will be a discrete step in certain measurements (including current, capacitance, watts, kvar, etc). Therefore, when evaluating the rate of change, it may be necessary to identify any of these discrete steps in the measurements and remove this effect from the calculated rate of change. This type of "expected" failure mode often goes undetected in many current capacitor bank installations due to the lack of three-phase monitoring data. A useful benefit of the foregoing feature is to detect capacitors that have failed in an "expected" manner and provide notification to the customer or to the manufacturer's services organization.

Once determined at block 413, the derived rate of change is then passed to the fifth functional area to compare against the baseline.

(5) Deviation from Baseline

Once the baseline rate of change is established and the current rate of change is determined, these two rates of change are compared to produce a deviation. For example, the analyze component 400 determines at block 415 if there is a deviation between the baseline rate of change and the calculated rate of change, and, if so, what the deviation is. If there is a deviation, the analyze component 400 stores deviation information for statistical analysis, as indicated at block 417. By way of example, the calculated rate of change can be compared against the baseline rate of change to identify whether or not the parameter (e.g., capacitance) is changing (e.g., percent capacitance change per year) at an unexpectedly high rate.

The logical comparison could be performed, for example, according to a statistical approach, from a simple mathematical comparison to a complex analysis of the data set to see if the statistical curve has shifted by a significant amount over time. A non-limiting example includes identifying whether the calculated rate of change is greater than the baseline rate of change plus a predetermined delta (i.e., a maximum allowable difference or threshold). For example, if the baseline rate of change for a parameter is 1% per year (or an equivalent amount over a shorter period), and the predetermined delta for this parameter is set as 0.5% per year, then an unacceptable deviation from the baseline would be detected if the calculated rate of change exceeds 1.5% per year. This comparison could be considered as determining whether the measured rate of change exceeds a certain envelope surrounding a theoretical aging curve for the parameter.

In some embodiments, the predetermined delta can vary depending on which steps are engaged/disengaged. For instance, a single capacitor 124 in a capacitor bank 118 may exhibit an accelerated aging pattern, for example, where the capacitance is decreasing at a higher-than-expected rate. When the only step engaged is the step 120 that includes the irregularly deteriorating capacitor 124, the measured capacitance should be seen to decrease at a rate that is higher than the baseline. However, when multiple steps 120 are engaged, one of which includes the irregularly deteriorating capacitor 124, the effect will be lessened, and the measured capacitance could be seen to decrease at a rate somewhere between the single-step rate and the baseline rate of change. Therefore, the delta applied in this comparison would be chosen based on not only the parameter being measured but also on the specific step contactor status values.

If a deviation from the baseline is detected (i.e., block 415=Yes) for the current contactor status combination and for the current measurement, then this deviation is recorded in block 417 for use in the statistical analysis of all observed deviations. If no deviation is detected (i.e., block 415=No), the program flow continues directly to the next loop as controlled by the first functional area. In both cases, the exemplary Analyze component 400 will proceed from block 415 or 417 to block 419 to determine if all of the measurements for the current contactor combination are finished. If not (i.e., block 419=No), the program flow returns to block 405 and queries the database 136 (or other data storage) for the next set of measurements that have the same set of contactor status values over the selected time interval, i.e., Rate 3. If so (i.e., block 419=Yes), the Analyze component 400 will proceed to block 421 to determine if all contactor status combinations are finished. If not (i.e., block 421=No), the program flow returns to block 403 and query the database 136 (or other data storage) for the next contactor status combination. Otherwise, the Analyze component 400 will continue to the sixth functional area, discussed below.

(6) Analysis of Deviations

After all combinations of step contactor values and measurement values have been evaluated according to areas (1)-(5), the Analyze component of FIG. 4 performs a statistical analysis of the deviations detected, as indicated at block 423, to estimate the health of a capacitor bank, each step in a capacitor bank, and/or each capacitor in a step. This statistical analysis is performed, in some embodiment, on the deviations detected for each combination of step contactor status values.

By way of non-limiting example, the health of each step 120 in a capacitor bank 118 can be expressed as a "confidence level". The confidence level can be an indication of the certainty that a respective step likely has problems or, contrastingly, is likely free of problems. This confidence level can be expressed numerically (e.g., as a percentage), graphically (e.g., via a corresponding icon), descriptively (e.g., via a narrative), or any other appropriate means. In an illustrative embodiment, the confidence level is presented as three possible values to simplify reporting to the user: Green (or low level)—no signs of problems for the step; Yellow (or medium level)—potential sign of problems for the step; Red (or high level)—high confidence that the step has problems. Recognizably, fewer or greater than three values can be utilized without deviating from the scope of the present disclosure.

The statistical analysis of the recorded deviations performed at block 423 may follow various different statistical approaches. Analysis of variance (ANOVA) techniques are one possibility to compare combinations in which only one contactor changed to determine if the change was statistically significant.

Another, more basic possible approach can include: first, reviewing the deviations that were detected when one and only one of the step contactors is engaged. In these cases, the step associated with the solely engaged contactor can be identified as the source of the deviation. Any steps that are identified in this manner are assigned a red confidence level. Second, review the deviations that were detected when two and only two of the step contactors are engaged. In each of these two-step combinations with a detected deviation, for any step that was not already assigned a red confidence level in the previous analysis, temporarily assign those steps a yellow confidence level for the two-step combination. Third, review the deviations that were detected when three and only three of the step contactors were engaged. In each of these three-step combinations with a detected deviation, for any step that was not previously assigned a red confidence level, temporarily assign those steps a yellow confidence level. This pattern continues to the point where any deviations were detected with N-1 of the step contactors engaged, marking each step temporarily with a yellow confidence level for the N-1-step combination. Finally, after analyzing all of the step contactor combinations, review the results for each step, one step at a time. If a step was assigned a red confidence level, or if it was previously disconnected due to a red confidence level (thus yielding no data for this interval), then the final confidence level for the step is red. Otherwise, check all step combinations where the step was assigned a temporary yellow confidence level. If all of these step combinations involved at least one step that has already been assigned a red confidence level, or if there are no combinations where the step was assigned a temporary yellow confidence level, then the final confidence level for these steps is green. Otherwise, the final confidence level is yellow.

The deviation analysis set forth above is just one possible implementation. Other approaches are envisioned, which possibly include an analysis of the step combinations observed that did not result in a deviation from the baseline, in order to lend further confidence to a green assessment.

In another optional configuration, if an "expected" failure mode is detected, where a self-protection mechanism within one of the capacitors 124 in a step 120 acts to remove the capacitor from the circuit, the corresponding capacitor and/or step can be assigned a yellow confidence level, and an appropriate notification sent to the user and/or services team. For example, if the rate of capacitance decline is deemed normal, but there is a significant change due to the operation of the protection systems, the step is designated yellow. Such action would imply that the step is operating below capacity, and that maintenance may be required to restore the step to the intended performance. Since there is no imminent danger associated with an "expected" failure mode, it is not assigned a red confidence level. Once the appropriate confidence level is assigned, the Analyze component 400 outputs the confidence level (or other indication) for selected steps (e.g., all red confidence levels) or all steps at block 425.

Figure 5:
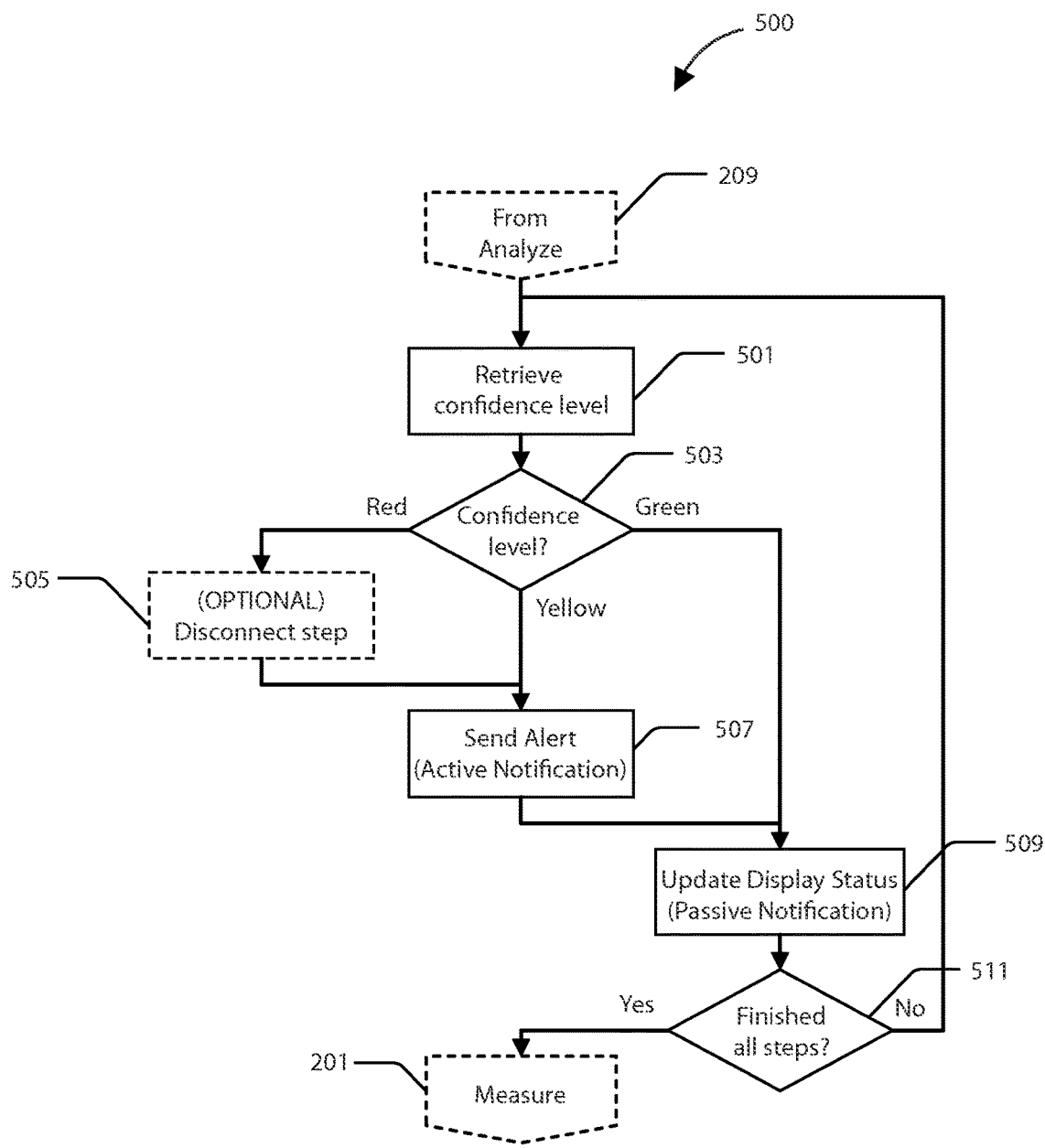
FIG. 5 is a flowchart of an exemplary action/decision component for the method presented in FIG. 2.

The exemplary Analyze component 400 of FIG. 4 provides a confidence level for each step as an input to the Action/Decision component identified in block 211 in FIGS. 2 and 4. FIG. 5 is a flowchart of an exemplary Action/Decision component, designated generally as 500, for the method 200 presented in FIG. 2. In the illustrated embodiment of FIG. 5, the Action/Decision component 500 loops through each step in the capacitor bank, inspecting the confidence level to determine the appropriate responsive course of action (if any). At block 501, for example, the confidence level is retrieved for each step 120 in the capacitor bank 118. The Action/Decision component 500 then determines at block 503 what confidence level is assigned to each step 120. Alternatively, blocks 501 and 503 can be combined to retrieve only preselected confidence levels (e.g., only steps assigned a red confidence level). According to block 505, if the confidence level assigned to a particular step is red, the capacitor bank monitoring system 110 may optionally act to disconnect the step, for example, using a contact output. This feature may be configurable, as it may be a desirable safety feature in some installations and undesirable in other installations.

If the confidence level for a step is red or yellow, an active notification can be initiated, for example, to alert the user or other appropriate personnel, as indicated by block 507 of FIG. 5. In some embodiments, this alert translates the identification of a potential problem into a recommended action/response strategy for the user or services personnel to undertake. Parties receiving this alert may include, for example, the user, the facility manager, and/or the manufacturer's services organization. The alert itself can be used to flag the step for repair (in the case of a red confidence) or inspection (in the case of a yellow confidence). It can also include the serial number or other related information to be used to check for a recall notice. The technology used for this alert may include, for example, a web push, SMS, etc, using the communication capabilities of the Monitor IED 128 or an alternate or remote computing device used for the analysis. Alternatively, the alert could be pushed through a monitoring software package, such as the PowerLogic® ION Enterprise software power management solution or another supervisory control and data acquisition (SCADA) software application.

Regardless of the confidence level for a step, a passive notification can be initiated to provide a static display of the current confidence level for all of the steps based, for example, on the most recent analysis. This status may be provided using a web based view, for example, directly from the Monitor IED 128. Alternatively, it could be included in a view provided by a monitoring software package, such as the PowerLogic® ION Enterprise software power management solution or other SCADA software application. The capacitor bank installation 100 can also integrate a local indicator of the confidence level for each step. One representative approach would be to provide a multi-colored LED device for each step, and to assert the appropriate color for each step based on the current confidence level.

In some embodiments, the method 200 of FIG. 2 includes at least those blocks enumerated above. It is also within the scope and spirit of the present disclosure to omit blocks, include additional blocks, and/or modify the order presented. It should be further noted that the method 200 represents a single cycle of monitoring one or more capacitor banks However, it is expected that the method 200 be applied in a repetitive and/or systematic manner.

Figure 6:
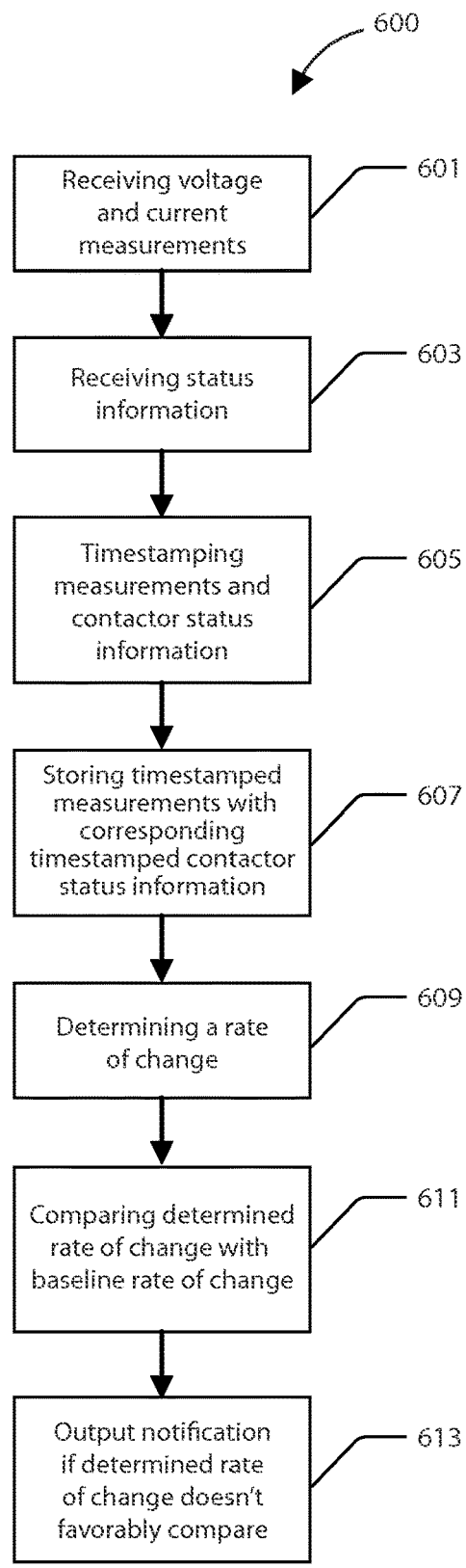
FIG. 6 is a flowchart of another exemplary algorithm or method of monitoring one or more capacitor banks according to various aspects of the embodiments disclosed herein.

With reference now to the flow chart of FIG. 6, an improved method 600 for monitoring one or more capacitor banks is generally described in accordance with various embodiments. FIG. 6 represents an exemplary algorithm that corresponds to at least some instructions that may be executed by a controller, such as the central processing unit (CPU) of a computer, to perform any or all of the following described functions associated with the disclosed concepts. The instructions corresponding to the algorithm 200 can be stored on a non-transitory computer-readable medium, such as on a hard drive or other mass storage device or a memory device.

The method 600 begins at block 601 by receiving measurements indicative of voltages or currents, or both, on respective electrical lines operatively coupled by corresponding contactors to the steps of the capacitor bank. At block 603, status information that is indicative of respective statuses of the contactors is received. The method 600 continues to block 605 where the measurements from block 601 and the contactor status information from block 603 are timestamped. Thereafter, the timestamped measurements and corresponding timestamped contactor status information are stored together at block 607. From this stored data, block 609 includes determining a rate of change of a parameter that is indicative of or derived from at least the measurements associated with at least one of the plurality of steps in the capacitor bank. The determined rate of change is compared with a baseline rate of change to produce a deviation (if any), as indicated in block 611. If a non-zero deviation is produced, block 613 includes determining if the deviation satisfies a criterion (e.g., exceeds a predetermined threshold). If so, block 613 responds by indicating the deviation satisfied the criterion (e.g., via assigning an appropriate confidence level and notifying the user of the confidence level).

While particular embodiments and applications of the present disclosure have been illustrated and described, it is to be understood that this disclosure is not limited to the precise construction and compositions disclosed herein and that various modifications, changes, and variations can be apparent from the foregoing descriptions without departing from the spirit and scope of the invention as defined in the appended claims.

What is claimed is:

1. A method of monitoring at least one capacitor bank having a plurality of steps, the method comprising:
   receiving measurements indicative of voltages or currents or both on respective electrical lines operatively coupled to the plurality of steps of the capacitor bank by corresponding contactors;
   receiving status information indicative of respective statuses of the contactors;
   timestamping the measurements and the contactor status information;
   storing the timestamped measurements with corresponding ones of the timestamped contactor status information;
   for at least some of the stored timestamped measurements and contactor statuses, determining a rate of change of a parameter indicative of or derived from at least the measurements associated with at least one step of the plurality of steps in the capacitor bank to determine a change in a status of the at least one step of the plurality of steps in the capacitor bank;
   comparing the determined rate of change with a baseline rate of change to calculate a deviation;
   determining if the deviation satisfies a criterion;
   responsive to the deviation satisfying the criterion, providing an indication that the deviation satisfied the criterion; and
   disconnecting, responsive to the deviation satisfying the criterion, the at least one step of the plurality of steps from the capacitor bank.

2. The method of claim 1, wherein the comparing includes determining a difference between the baseline rate of change and the determined rate of change, wherein the deviation satisfies the criterion if the difference exceeds a predetermined threshold, and wherein the indicating includes, responsive to the difference exceeding the predetermined threshold, displaying an indication that the associated step has a potential problem.

3. The method of claim 1, further comprising:
   determining a confidence level for each of the steps in the capacitor bank, the confidence level indicating a confidence of a potential problem for each of the steps; and
   indicating the confidence level for each of the steps.

4. The method of claim 3, wherein the confidence level includes a high level, a medium level, and a low level, the method further comprising:
   assigning the high level of confidence to respective ones of the steps when the respective step always, within a period of observation, yields a deviation between the determined rate of change for that step and the baseline rate of change;
   assigning the medium level of confidence to respective ones of the steps in a two-step combination which yield a deviation for any of the steps not assigned the high level of confidence; and
   assigning the low level of confidence to respective ones of the steps in a combination of steps not associated with any deviations between the determined rate of change for that step and the baseline rate of change.

5. The method of claim 4, further comprising:
   communicating at least one instruction to cause a disconnection of the respective ones of the steps assigned the high level of confidence.

6. The method of claim 1, further comprising:
   disregarding respective ones of the measurements that are unstable due to a recent status change of one or more of the corresponding contactors.

7. The method of claim 6, wherein the disregarding includes discarding respective ones of the measurements taken within a predefined interval after the recent status change of the one or more corresponding contactors.

8. The method of claim 6, further comprising:
   comparing a set of status information values from a previous measurement interval to a set of status information values in a current measurement interval; and
   concluding that the measurements are unstable if the previous set of status information values is different from the current set of status information values.

9. The method of claim 1, further comprising:
   normalizing the measurements against a normalizing parameter.

10. The method of claim 9, wherein the normalizing parameter includes voltage magnitude, measured frequency, measured reactive power, or ambient temperature.

11. The method of claim 1, wherein the determining the rate of change includes identifying discrete steps in the measurements, and removing the discrete steps when determining the rate of change.

12. The method of claim 1, wherein the determining the rate of change includes calculating a best-fit curve and measuring the slope of the best-fit curve at a predefined interval.

13. The method of claim 1, further comprising:
   calculating a value for a predetermined parameter from the received measurements, wherein the calculating the predetermined parameter and the receiving status information are substantially synchronized.

14. The method of claim 1, wherein the receiving the status information includes receiving the status information from the contactors or receiving the status information from a power factor correction (PFC) controller operatively connected to the contactors.

15. The method of claim 1, wherein the baseline rate of change is a preset value for a given type of parameter.

16. The method of claim 1, further comprising:
   determining a new baseline rate of change each time the received status information includes a new contactor status combination not previously received.

17. The method of claim 1, further comprising:
   determining the baseline rate of change for one electrical phase of a phase-specific measurement from measurements for at least two other electrical phases.

18. The method of claim 1, wherein the determined rate of change and the baseline rate of change are in units of percent change of the predetermined parameter per unit time.

19. One or more machine-readable non-transitory storage media including instructions which, when executed by one or more processors, cause the one or more processors to perform operations associated with a capacitor bank monitoring system, the operations comprising:
 receiving measurements indicative of voltages or currents or both on respective electrical lines operatively coupled to a plurality of steps in a capacitor bank by corresponding contactors;
 receiving status information indicative of respective statuses of the contactors;
 timestamping the measurements and the contactor status information;
 storing the timestamped measurements with corresponding ones of the timestamped contactor status information;
 for at least some of the stored timestamped measurements and contactor statuses, determining a rate of change of a parameter indicative of or derived from at least the measurements associated with at least one step of the plurality of steps in the capacitor bank to determine a change in a status of the at least one step of the plurality of steps in the capacitor bank;
 comparing the determined rate of change with a baseline rate of change to calculate a deviation;
 determining if the deviation satisfies a criterion;
 responsive to the deviation satisfying the criterion, indicating the deviation satisfied the criterion; and
 disconnecting, responsive to the deviation satisfying the criterion, the at least one step of the plurality of steps from the capacitor bank.

20. A capacitor bank monitoring system for monitoring a plurality of capacitor banks each having a plurality of steps, each of the steps including at least one capacitor, the monitoring system comprising:
 one or more processors; and
 one or more memory devices storing instructions which, when executed by the one or more processors, cause the capacitor bank monitoring system to perform the following operations:
  receiving measurements indicative of voltages and currents on respective electrical lines selectively coupled through corresponding contactors to the plurality of steps in each of the plurality of capacitor banks;
  receiving status information indicative of a respective binary status of each of the contactors;
  timestamping the measurements and the contactor status information;
  storing each of the timestamped measurements with a corresponding combination of the timestamped contactor status information;
  for each contactor status combination, calculating a rate of change indicative of degradation of each of the steps in each of the capacitor banks;
  comparing the calculated rate of change with a baseline rate of change to determine if a deviation exists between the baseline rate of change and the calculated rate of change;
  if the deviation exists for at least one step of the plurality of steps, analyzing the deviation to determine if the deviation satisfies a criterion;
  if the deviation satisfies the criterion, outputting a notification indicating that the deviation satisfies the criterion; and
 if the deviation satisfies the criterion, disconnecting the at least one step of the plurality of steps from the plurality of capacitor banks.

* * * * *